US010499503B2

(12) United States Patent
Seo

(10) Patent No.: US 10,499,503 B2
(45) Date of Patent: Dec. 3, 2019

(54) WEARABLE DEVICE AND METHOD FOR MANUFACTURING SAME

(71) Applicant: AMOGREENTECH CO., LTD., Gimpo-si (KR)

(72) Inventor: In Yong Seo, Seoul (KR)

(73) Assignee: AMOGREENTECH CO., LTD., Gimpo-si (KR)

(*) Notice: Subject to any disclaimer, the term of this patent is extended or adjusted under 35 U.S.C. 154(b) by 0 days.

(21) Appl. No.: 15/758,527

(22) PCT Filed: Sep. 23, 2016

(86) PCT No.: PCT/KR2016/010632
§ 371 (c)(1),
(2) Date: Mar. 8, 2018

(87) PCT Pub. No.: WO2017/052254
PCT Pub. Date: Mar. 30, 2017

(65) Prior Publication Data
US 2018/0255636 A1 Sep. 6, 2018

(30) Foreign Application Priority Data
Sep. 23, 2015 (KR) .......... 10-2015-0134870

(51) Int. Cl.
H05K 1/03 (2006.01)
H05K 3/12 (2006.01)
D04H 1/728 (2012.01)
A41D 1/00 (2018.01)

(52) U.S. Cl.
CPC ............. *H05K 1/038* (2013.01); *D04H 1/728* (2013.01); *H05K 3/12* (2013.01); *A41D 1/002* (2013.01);
(Continued)

(58) Field of Classification Search
CPC ........ H05K 1/038; H05K 1/0212; H05K 3/12; H05K 2201/0278; H05K 2201/05;
(Continued)

(56) References Cited

U.S. PATENT DOCUMENTS 4,185,133 A * 1/1980 Woerner ............... B29B 15/122
118/60
2002/0180605 A1 12/2002 Ozguz et al.
(Continued)

FOREIGN PATENT DOCUMENTS

KR 20110109717 10/2011
KR 101092645 12/2011
(Continued)

OTHER PUBLICATIONS

Park et al., 2011, KR101092645 English Translation (Year: 2011).*
International Search Report—PCT/KR2016/010632 dated Dec. 22, 2016.

*Primary Examiner* — Steven T Sawyer
(74) *Attorney, Agent, or Firm* — Cantor Colburn LLP

(57) ABSTRACT

Provided is a wearable device and a method of manufacturing the same. The wearable device includes: a wearable flexible printed circuit board having a circuit pattern formed on a base substrate having flexibility, air-permeability, and waterproofness; and a functional module mounted on the wearable flexible printed circuit board.

12 Claims, 15 Drawing Sheets

(52) U.S. Cl.
CPC ............... *D10B 2401/18* (2013.01); *D10B 2403/02431* (2013.01); *H05K 2201/0278* (2013.01); *H05K 2201/0293* (2013.01); *H05K 2201/05* (2013.01)

(58) Field of Classification Search
CPC .......... H05K 2201/10151; D04H 1/728; G06F 1/16; G06F 3/00
USPC ....................................................... 361/749
See application file for complete search history.

(56) References Cited

U.S. PATENT DOCUMENTS

| | | | |
|---|---|---|---|
| 2011/0226515 A1* | 9/2011 | Son | H01L 23/49827 |
| | | | 174/259 |
| 2014/0110859 A1* | 4/2014 | Rafferty | H01L 23/4985 |
| | | | 257/774 |
| 2014/0318699 A1* | 10/2014 | Longinotti-Buitoni | ................. |
| | | | A61B 5/0002 |
| | | | 156/247 |
| 2014/0376191 A1* | 12/2014 | Hwang | F28F 13/003 |
| | | | 361/720 |
| 2016/0270223 A1* | 9/2016 | Cherenack | H05K 1/0283 |
| 2017/0196513 A1* | 7/2017 | Longinotti-Buitoni | ................. |
| | | | A61B 5/6804 |

FOREIGN PATENT DOCUMENTS

| | | |
|---|---|---|
| KR | 20110138862 | 12/2011 |
| KR | 101139970 | 4/2012 |
| KR | 20150026387 | 3/2015 |
| KR | 20150089283 | 8/2015 |

* cited by examiner

ND METHOD FOR
WEARABLE DEVICE AND METHOD FOR MANUFACTURING SAME

TECHNICAL FIELD

The present invention relates to a wearable device, and more particularly, to a wearable device capable of improving flexibility, restorability, waterproofness and air-permeability by using a wearable flexible printed circuit board in which a circuit pattern is formed on a fiber web that is formed by accumulating fibers and that has a plurality of pores, and a method of manufacturing the same.

BACKGROUND ART

In the recent electronics industry, wearable devices are emerging as a successor to smart phones.

Wearable devices are collectively referred to as electronic devices that can be worn on the body while performing smart functions, and that input, output, and process information.

Currently, the world wearable device market is at an early stage, but research and development associated with the wearable devices is accelerating, and global companies are also anticipating that new products will be released in the future, and that the market will be open in the future and grow rapidly.

The wearable device may be implemented in the form of being worn on the body without carrying it in the hand, and may be applied to products which can become part of the body. Basically, the wearable device may be applied to various kinds of products of shirts, pants, accessories such as glasses, bracelets, and watches, and shoes.

Typically, smart watches and smart glasses may be referred to as smart devices. Here, smart watches may function as watches worn on the wrist, perform phone functions like a mobile phone, and implement various smart functions such as text messaging, e-mail, and web surfing. Smart glasses may include glasses functions, camera functions and image viewing functions.

Meanwhile, since the wearable device is an electronic device, a wearable printed circuit board is required and its performance makes an influence upon product characteristics.

Korean Patent Application Publication No. 10-2015-0089283 discloses a wearable terminal including: a communication unit for communicating with at least one external device; a memory unit for storing at least one of an image to be photographed and a sound to be sensed; a biometric information detection unit for detecting biometric information from a user's body; and a control unit for controlling the communication unit to transmit at least one of the stored image and sound to the external device according to the detected biometric information. However, the wearable terminal of Korean Patent Application Publication No. 10-2015-0089283 does not disclose a detailed description of a printed circuit board on which the communication unit, the biometric information detection unit, and the control unit are electrically connected.

Korean Patent Registration No. 10-1139970 discloses a method of manufacturing a flexible printed circuit board including: a first step of forming a circuit pattern on a seed layer formed on a soft insulating substrate; a second step of applying a first photosensitive material on the circuit pattern; a third step of exposing and developing the first photosensitive material to form a protective pattern on the circuit pattern; a fourth step of etching the seed layer; and a fifth step of removing the protective pattern, wherein the first photosensitive material is a liquid or film type photosensitive material, to thereby implement the flexible printed circuit board. Since a base member is a soft insulating substrate such as a polyimide film, there is no restoring characteristic of being unfolded or re-spread after being folded or wrinkled, and there is no air-permeability to thus cause inconveniences when worn. As a result, the characteristics of the wearable device may be deteriorated.

DISCLOSURE

Technical Problem

It is an object of the present invention to provide a wearable device that can be worn on a wearer's body by using a wearable flexible printed circuit board excellent in elasticity and a method of manufacturing the wearable device.

Another object of the present invention is to provide a wearable device capable of improving flexibility, restorability, waterproofness and air-permeability by using a wearable flexible printed circuit board in which a circuit pattern is formed on a fiber web that is formed by accumulating fibers and that has a plurality of pores, and a method of manufacturing the same.

Technical Solution

According to an aspect of the present invention, there is provided a wearable device including: a wearable flexible printed circuit board having a circuit pattern formed on a base substrate having flexibility, air-permeability, and waterproofness; and a functional module mounted on the wearable flexible printed circuit board.

The wearable flexible printed circuit board may include: the base substrate made of a fiber web formed by accumulating a polymer fiber spun; and the circuit pattern formed on the base substrate.

The fiber web may have a plurality of pores.

The circuit pattern may be formed on the polymer fibers and pores of the fiber web or on the fibers of the fiber web.

In addition, the circuit pattern may be a conductive paste printed on the fiber web, and the conductive paste may be an Ag paste or a Cu paste.

The porosity of the fiber web may be in a range of 40% to 80%, and the diameter of the polymer fibers may be 3 µm or less.

The base substrate may have a thickness of 20 µm to 100 µm and when the circuit patterns are formed on the upper and lower sides of the base substrate, respectively, the circuit patterns formed on the upper and lower sides may not be energized with each other.

Furthermore, the thickness of the base substrate may be in a range of 5 µm to 20 µm, and the circuit patterns formed on the base substrate may be vertically energized.

Moreover, the fiber web is a three-layer fiber web structure composed of an upper layer, an intermediate layer and a lower layer, and the fiber web in the intermediate layer may be a web having a fiber diameter smaller than those of the upper and lower layers, or a non-porous web.

The fiber web may be in a non-porous state.

In addition, the base substrate may include: a strength reinforcing support; and the fiber web laminated on one side or both sides of the support.

The function module may perform at least one of a body condition measurement function, a wireless communication function, an electronic device control function, a lighting function, a vibration detection function, a peripheral sound detection function, a position detection function, a black box function, a heat generation function, and a motion sensing function.

In this case, the functional module may include at least one active element and at least one passive element.

In addition, the functional module may include: a sensor unit; a short range communication module having an antenna pattern and used for short range wireless communication; and a control unit for signaling a sensing signal sensed by the sensor unit and wirelessly transmitting the sensed signal to a terminal by using the short distance communication module.

Furthermore, the sensor unit may include at least one of a biosensor for detecting a user's physical condition and an environmental detection sensor for sensing a peripheral environment.

The passive element may be a heater pattern.

The wearable device according to an embodiment of the present invention may further include a power module electrically connected to the wearable flexible printed circuit board to apply power to the functional module.

According to another aspect of the present invention, there is provided a method of manufacturing a wearable device, the method including: preparing a functional module; preparing a wearable flexible printed circuit board including a fiber web formed by accumulating fibers obtained by electrospinning a spinning solution containing a polymer and a solvent and a circuit pattern formed on the fiber web; and electrically connecting the functional module to the wearable flexible printed circuit board.

The preparing of the wearable flexible printed circuit board may include: forming a base substrate made of a fiber web accumulating fibers obtained by electrospinning a spinning solution containing a mixture of a polymer and a solvent in which the fibers have a plurality of pores; printing a conductive paste on the fiber web to form a circuit pattern; and curing the printed conductive paste.

In addition, in the forming of the circuit pattern by printing the conductive paste on the fiber web, the circuit pattern may be formed on the fibers and the pores of the fiber web or may be formed on the fibers of the fiber web.

In addition, in the forming of the base substrate, the spinning solution may be electrospun in a humidity environment of 60% to 80% and the corrugated fibers are accumulated, to thus form the base substrate made of the fiber web.

In addition, in the forming of the base substrate, the spinning solution may be electrospun in a humidity environment of 60% or less and the straight-line shaped fibers are accumulated, to thus form the base substrate made of the fiber web.

Advantageous Effects

According to some embodiments of the present invention, a wearable device that can be excellently worn on a user's body can be realized by using a wearable flexible printed circuit board having excellent elasticity.

In addition, according to some embodiments of the present invention, a wearable flexible printed circuit board included in a wearable device is formed by forming a circuit pattern on a fiber web that is formed by accumulating fibers, and may have excellent warpage characteristics in comparison with a polyimide film used in a general flexible printed circuit board, and restoring characteristics (a property capable of returning to an original flat state even after being folded or wrinkled) that does not exist in the polyimide film.

In addition, according to some embodiments of the present invention, a wearable flexible printed circuit board in which a circuit pattern is formed on a fiber web having a plurality of pores and formed by accumulating nano-sized fibers is applied to a wearable device to improve the flexibility, waterproofness, restoring capability, and air-permeability.

BEST MODE

Hereinafter, embodiments of the present invention will be described in detail with reference to the accompanying drawings.

Figure 1:
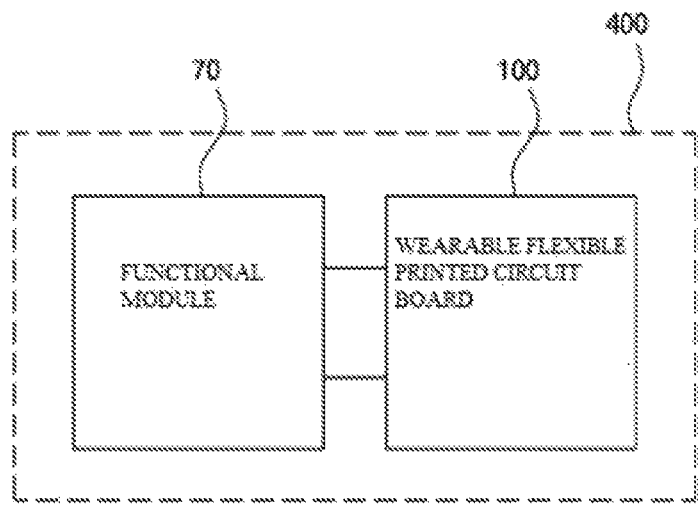
FIG. 1 is a block diagram of a wearable device according to a first embodiment of the present invention.

Referring to FIG. 1, a wearable device 400 according to a first embodiment of the present invention includes: a functional module 70 for performing at least one of a body condition measurement function, a wireless communication function, an electronic device control function, a lighting function, a vibration detection function, an ambient sound detection function, a position detection function, a black box function, a heat generation function, and a motion sensing function; and a wearable flexible printed circuit board 100 including a fiber web formed by accumulating fibers obtained by electrospinning a spinning solution in which a polymer and a solvent are mixed, and a circuit pattern formed on the fiber web, and electrically connected to the functional module 70.

The functional module 70 may include at least one active electronic component and at least one passive electronic component depending on the function of the module, or may be only composed of at least one passive electronic component. The circuit pattern formed on the fiber web of the printed circuit board 100 serves to interconnect the at least one active electronic component and the at least one passive electronic component. Details of the circuit pattern will be described later.

The wearable device according to an embodiment of the present invention is provided with a wearable flexible printed circuit board 100 excellent in elasticity to improve body wearing characteristics and may be integrated with wearing articles such as clothes, hats, and shoes.

The wearable flexible printed circuit board 100 functions as a base board or a connector on which electrical wirings for inputting and outputting signals and for power supply for the inner and outer portions of the functional module 70 are formed.

Wearable devices may be applied as devices for driving wearable articles including, for example, smart shirts, polo tech shirts, smart socks, smart suits, navigation jackets, smart shoes, body size measuring apparel, hug jackets, Intel's Mimo Baby Monitors, life tech jackets, heating jackets, heating insoles, cycle jackets, and the like. The wearable device according to the embodiment of the present invention is not limited to the above-described example, and can be applied to all cases in which the wearable flexible printed circuit board 100 is used.

The wearable device is provided with a wearable flexible printed circuit board 100 having a circuit pattern 120 formed on a fiber web 110 having a plurality of pores and formed by accumulation of nano-sized fibers, and may implement a device having excellent flexibility, waterproofness, restoring capability, and air-permeability.

The functional module 70 is a module configured to perform any one function selected from among, for example, a body condition measurement function, a vibration sensing function, a peripheral acoustic sensing function, a motion sensing function, an environmental sensing function for sensing ambient conditions such as temperature, humidity, gas, and luminosity, a wireless communication function, a NFC tag function, an electronic device control function, a lighting function, a heating function, a position sensing function, and a black box function, or a combination of these functions. The functional module 70 according to the embodiment of the present invention is not limited to the above-described example, and can be applied to various types of cases in which the wearable flexible printed circuit board 100 is used.

Here, the smart shirt is a shirt which may measure heartbeat, body temperature, blood pressure, respiration, heart rate, electrocardiogram and the like, and may be implemented by using a functional module having a body condition measuring function according to the embodiment of the present invention. The polo tech shirt is a shirt that measures a wearer's movement, heart rate, breathing, energy output, stress level and sends the measured result to a smartphone through Bluetooth. The polo tech shirt may be equipped with a functional module including a body condition measurement function and a wireless communication function of a wearable device to perform the function of this shirt.

In addition, the smart sock is a sock that may analyze the load exerted on the foot, calibrate the gait, and calculate the number of gaits, the speed, and the calories consumed. The smart suit is a suite in which a NFC tag is inserted into a pocket of the suit, and a mobile phone is put in and out of the pocket, to thus automatically control the operation of the mobile phone, such as unlocking the screen, etiquette mode, business card transmission, and access control.

The navigation jacket is a jacket that tells the way by LED and vibration. The smart shoe is a navigation shoe that tells the way by the vibration. The body size measurement apparel is the garment that measures the figure of the body when the body size measurement apparel is worn, and that helps a wearer do a shopping to fit the wearer's body using the collected body dimensions. The hug jacket is a jacket that gives a feeling of a hug that the connected jacket swells up like a balloon when a dedicated application is touched.

The Intel's Mimo Baby Monitor monitors not only the baby's breath but also the baby's skin temperature, posture, and activity, and transmits the sound and environmental information around the baby together with the monitored result. The life tech jacket is a jacket designed to be used for the purpose of overcoming the external situation and maintaining the body when the worst situation, with a heating function, a black box function, a distress signal transmission function, etc. The heating jacket and the heating insole are a heatable jacket and a heatable insole. The cycle jacket is a jacket that may control the flashing for directional indication by raising the hand up. The wearable device according to the embodiment of the present invention may be applied to realize such a wearable article.

Figure 2:
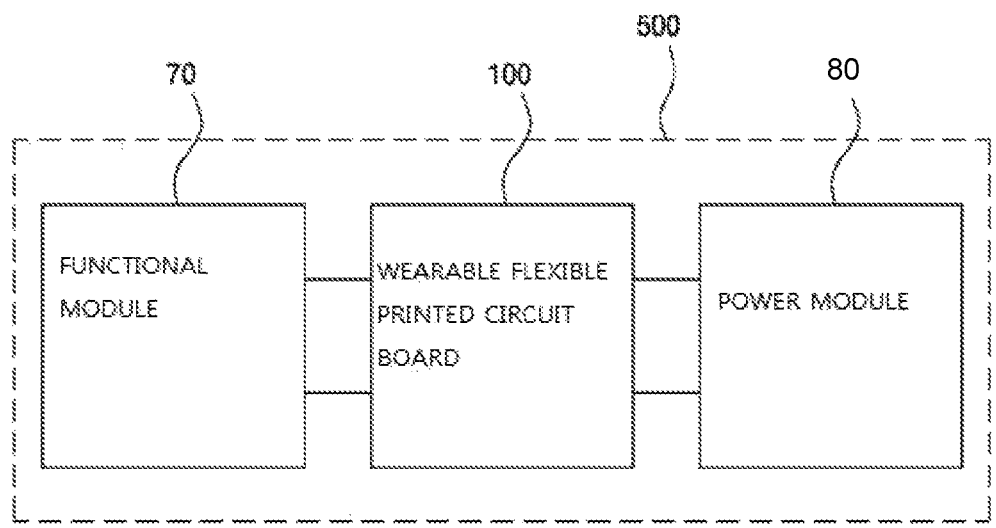
FIG. 2 is a block diagram of a wearable device according to a second embodiment of the present invention.

Referring to FIG. 2, the wearable device 500 according to a second embodiment of the present invention includes a functional module 70; a power module 80 for applying power to the functional module 70; and a wearable flexible printed circuit board 100 for electrically connecting the functional module 70 and the power module 80.

The functional module 70 and the power module 80 are implemented in an electric connection structure mounted on the wearable flexible printed circuit board 100 or the wearable flexible printed circuit board 100 is implemented in an electric connection structure fixed to the functional module 70 and the power module 80.

The power module 80 may be a thin flexible battery.

As described above, a smart garment 600 (FIG. 3) and a pair of smart glasses 700 (FIG. 4) may also be implemented by applying the wearable devices 400 and 500 according to the first and second embodiments.

Figure 5:
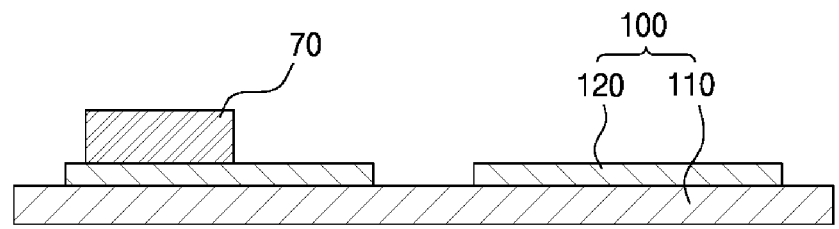
FIG. 5 is a cross-sectional view of the wearable device according to the first embodiment of the present invention.
Figure 6:
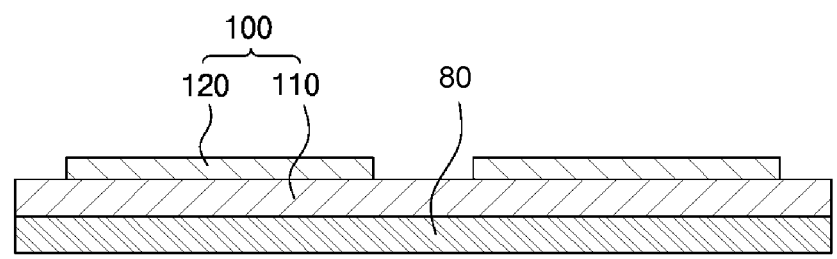
FIG. 6 is a cross-sectional view of the wearable device according to the second embodiment of the present invention.
Figure 7:
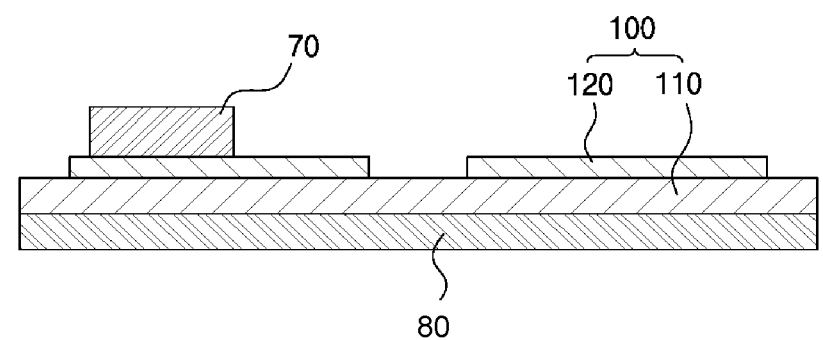
FIG. 7 is a cross-sectional view of another coupling state of the wearable device according to the second embodiment of the present invention.

Referring to FIGS. 5 to 7, in the wearable device according to the first embodiment of the present invention, the function module 70 may be mounted on the wearable flexible printed circuit board 100 to be integrated with the wearable flexible printed circuit board 100. In the wearable device according to the second embodiment of the present invention, the functional module 70 and the power module 80 may be mounted on the wearable flexible printed circuit board 100 so that the functional module 70 and the power module 80 may be integrated with the wearable flexible printed circuit board 100, and may be electrically connected with each other through conductive vias (not shown) formed on the wearable flexible printed circuit board 100.

As described below, in some embodiments of the present invention, the wearable flexible printed circuit board 100 includes a fiber web 110 serving as a base substrate, and a circuit pattern 120 formed on the fiber web 110 and interconnecting electronic components forming the function module 70.

Therefore, as shown in FIG. 5, the wearable device according to the first embodiment of the present invention may be implemented into a coupling structure in which at least one functional module 70 is coupled to one surface of the fiber web 110 of the wearable flexible printed circuit board 100 and the functional module 70 is electrically connected by the circuit pattern 120.

The wearable device according to the second embodiment of the present invention may be implemented into a coupling structure, in which the power module 80 is coupled to the fiber web 110 of the wearable flexible printed circuit board 100, and the circuit pattern 120 and the power module 80 are electrically connected with each other through the conductive vias (not shown), as shown in FIG. 6, or the functional module 70 is coupled to one side of the fiber web 110 of the wearable flexible printed circuit board 100, the power module 80 is coupled to the other side of the fiber web 110, and the functional module 70 and the power module 80 are electrically connected to each other by the circuit pattern 120, as shown in FIG. 7.

Figure 8:
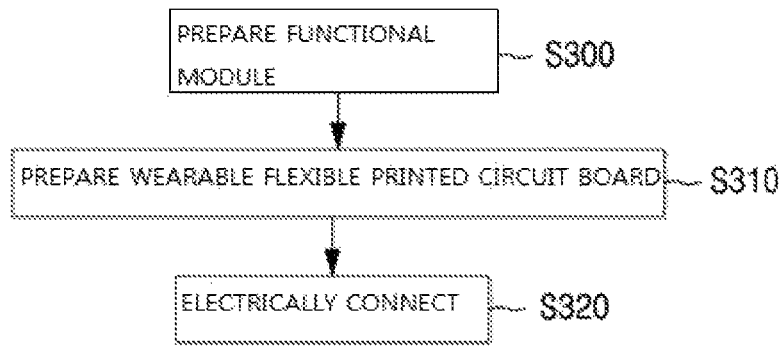
FIG. 8 is a flowchart of a method of manufacturing the wearable device according to the first embodiment of the present invention.

Referring to FIG. 8, a method of manufacturing a wearable device according to the first embodiment of the present invention includes preparing a functional module 70 (S300), and preparing a wearable flexible printed circuit board 100 including a fiber web 110 formed by accumulating polymer fibers obtained by electrospinning a spinning solution containing a fiber formation polymer material and a solvent, to thus play a role of a base substrate and a circuit pattern 120 formed on the fiber web 110 (S310). Thereafter, the functional module 70 is electrically connected to the wearable flexible printed circuit board 100 (S320).

Figure 9:
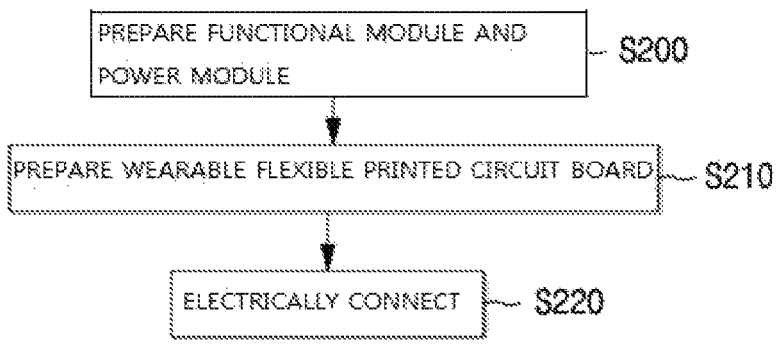
FIG. 9 is a flowchart of a method of manufacturing the wearable device according to the second embodiment of the present invention.

In addition, referring to FIG. 9, a method of manufacturing a wearable device according to a second embodiment of the present invention includes preparing a functional module 70 and a power module 80 for applying power to the functional module 80 (S200), preparing a wearable flexible printed circuit board 100 (S210), and electrically connecting the functional module 70 and the power module 80 by using the wearable flexible printed circuit board 100 (S220).

Figure 10:
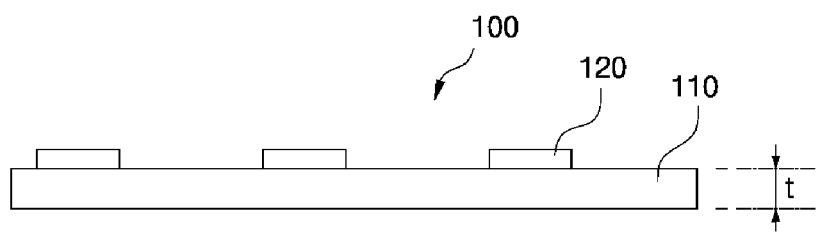
FIG. 10 is a conceptual cross-sectional view for explaining an example of a wearable flexible printed circuit board applied to an embodiment of the present invention.

Referring to FIG. 10, a wearable flexible printed circuit board 100 that is applied to a wearable device according to an embodiment of the present invention includes: a fiber web 110 formed by accumulating fibers obtained by electrospinning a spinning solution containing a mixture of a fiber formation polymer material and a solvent and used as a base substrate; and a conductive circuit pattern 120 formed on the fiber web 110.

Since the fiber web 110 is made by accumulating polymer fibers, the fiber web 110 has an excellent warping characteristic in comparison with a polyimide film used in general flexible printed circuit boards and a restoration characteristic capable of returning to an original flat state although being folded or wrinkled and that does not exist in the polyimide film.

Figure 11:
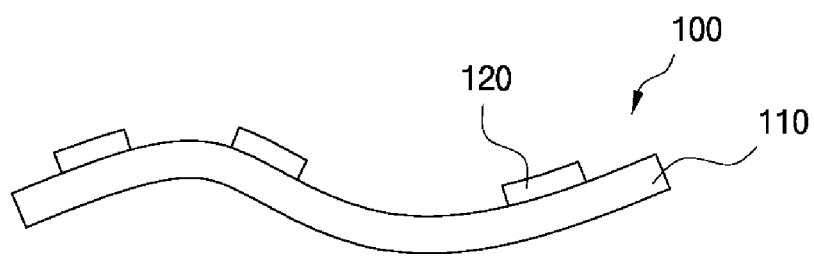
FIG. 11 is a conceptual cross-sectional view for explaining another example of a wearable flexible printed circuit board applied to an embodiment of the present invention.
Figure 17:
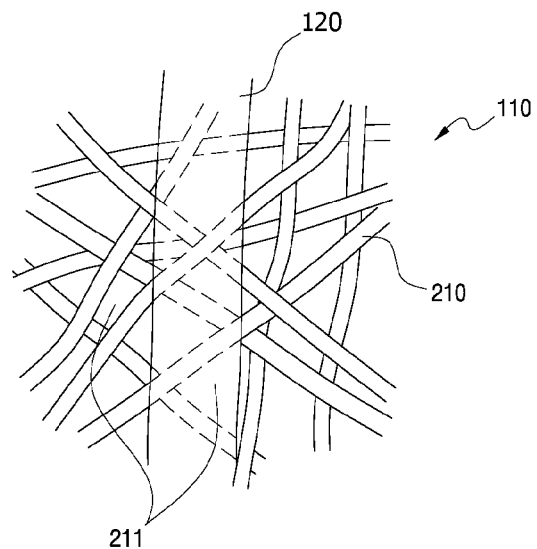
FIG. 17 is a schematic view for explaining a state in which a circuit pattern is formed on a fiber web according to an embodiment of the present invention.
Figure 18:
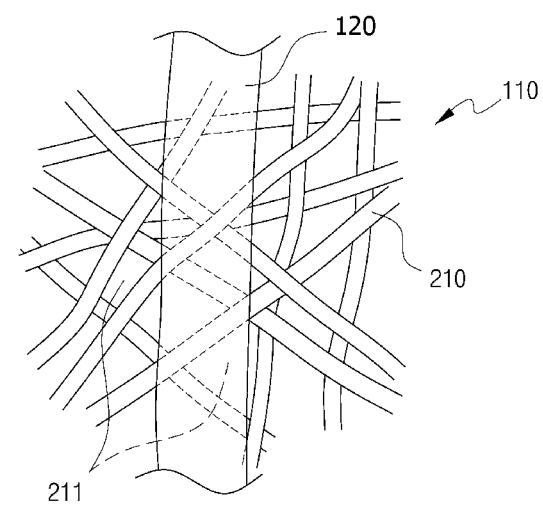
FIG. 18 is a schematic view for explaining another state in which a circuit pattern is formed on a fiber web according to an embodiment of the present invention.

In other words, since the circuit pattern 120 is formed on the surfaces of the fibers 210 constituting the fiber web 110, as shown in FIGS. 17 and 18, the wearable flexible printed circuit board 100 according to an embodiment of the present invention has flexibility due to the superior flexibility of each of the fibers 210 and the portions where the circuit pattern 120 is not formed, in which the circuit pattern 120 formed on the fibers are also bent together when the fiber web 110 is bent as shown in FIG. 11. In addition, since the printed circuit board 100 according to an embodiment of the present invention is formed by randomly accumulating a plurality of fibers 210, the printed circuit board 100 may have the minimum restoration characteristic required for the wearable flexible printed circuit board 100 after being folded or crumpled.

In addition, since the fiber web 110 is a web-shaped sheet formed by accumulating fibers obtained by electrospinning, the thickness t of the fiber web 110 may be made as thin as possible, and the fiber web 110 may be applied to future-oriented devices such as ultra-thin and super-light devices and wearable devices.

In other words, as described above, since the fiber web 110 is a web structure sheet formed by accumulating fibers obtained by electrospinning a spinning solution containing a fiber formation polymer material and a solvent, the thickness t of the fiber web 110 is made as thin as possible. As a result, the fiber web 110 may be used as a base substrate of the wearable flexible printed circuit board 100, and may be applied to a future-oriented device such as an ultra-thin and super-light device and a wearable device.

The wearable device may be applied to, for example, healthcare apparel, entertainment apparel, environmentally sensitive apparel, military special purpose apparel, or the like, when being applied to apparel.

In this case, the fiber web 110 may be obtained by electrospinning the spinning solution to have a fiber diameter of, for example, in the range of 400 nm to 3 μm, and the thickness of the fiber web 110 preferably in a range of 0.005 mm to 5 mm, more preferably, in a range of 5 μm to 100 μm.

The fiber web 110 may be formed into a state having a plurality of pores or a non-porous state by falling and accumulating fibers obtained by electrospinning.

The fiber web 110 may be formed in a porous film state or in a non-porous film state having a plurality of fine pores 211 as shown in FIGS. 17 and 18 by falling and accumulating fibers obtained by electrospinning.

Here, when the fiber web 110 has a plurality of pores 211, the wearable flexible printed circuit board may be provided with air-permeability. Therefore, the wearable flexible printed circuit board has an optimal function and structure so as to be applied as a printed circuit board necessary for constructing a circuit by interconnecting a wearable garment to be worn on a human body and various parts of an electronic apparatus.

That is, sweat is generated in the human body, to control the body temperature according to the external environment, and the sweat is evaporated and discharged to the outside in a water vapor state. The water vapor vaporized from sweat passes through the wearable flexible printed circuit board according to an embodiment of the present invention having air-permeability, to then be discharged to the outside. Accordingly, the wearable flexible printed circuit board according to the embodiment of the present invention becomes a printed circuit board having flexible, air-permeable, and waterproof functions required of a wearable printed circuit board in comparison with a conventional flexible printed circuit board having no air-permeability.

Figure 12:
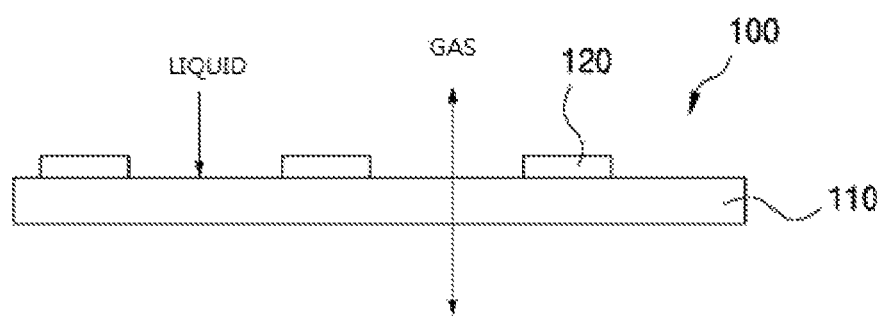
FIG. 12 is a conceptual cross-sectional view for explaining still another example of a wearable flexible printed circuit board applied to an embodiment of the present invention.

Particularly, since the fiber diameters of the fibers of the fiber web 110 may be implemented in a nano-size of 3 μm or less, the pore size of the fiber web 110 becomes small. Accordingly, as shown in FIG. 12, the fiber web 110 may have waterproofness and air-permeability in which gas passes through the fiber web 110 but the liquid cannot pass through the fiber web 110. Therefore, the wearable flexible printed circuit board according to the embodiment of the present invention may be applied to a future type device having a waterproof function.

The porosity of the fiber web 110 according to some embodiments of the present invention is preferably, for example, in a range of 40% to 80%. However, the porosity of the fiber web 110 may vary greatly depending on the occupancy of the conductive circuit pattern 120 printed on the fiber web 110.

As described above, the wearable flexible printed circuit board according to the embodiment of the present invention has flexibility and air-permeability, has properties of being folded, crumpled and then restored, and is waterproof. Thus, the wearable flexible printed circuit board according to the embodiment of the present invention has excellent physical properties applicable to substrates for wearable devices to be manufactured in the future.

Figure 13:
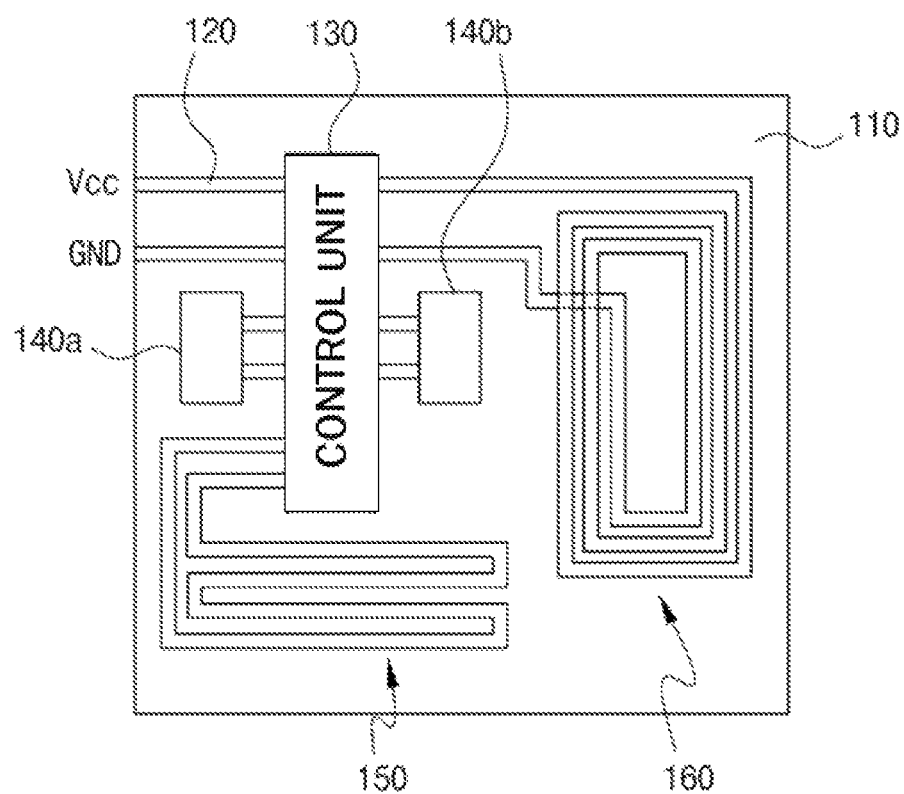
FIG. 13 is a conceptual diagram illustrating a wearable device implemented by using a wearable flexible printed circuit board according to an embodiment of the present invention.

FIG. 13 is a conceptual diagram illustrating a wearable device implemented by using a wearable flexible printed circuit board according to an embodiment of the present invention, in which the fiber web 110 is a flat sheet, and the circuit pattern 120 may be formed by patterning a conductive material on the fiber web 110 in various patterns.

The wearable device according to an embodiment of the present invention has a structure in which at least one functional module 70 is mounted on a wearable flexible printed circuit board 100, as shown in FIGS. 5 and 7.

FIG. 13 shows an example of a wearable device having a signal processing function, a sensing function, a wireless communication function, and a heating function, as the function of the at least one functional module 70.

The wearable device according to an embodiment of the present invention includes: a wearable flexible printed circuit board on which a circuit pattern 120 is formed on a fiber web 110; a control unit 130 for performing signal processing and wireless communication functions; a sensor unit 140a including at least one of an electrocardiogram and electromyogram sensor for measuring a user's heartbeat and respiration, blood glucose/blood pressure sensors, a temperature sensor, a humidity sensor, a gas sensor, a luminosity sensor, and an infrared sensor for detecting peripheral environmental elements; a short range communication module 140b used for short range wireless communication; an antenna pattern 160 used for wireless communication; and a heater pattern 150 for generating heat according to an external environment.

Two power terminal ends Vcc and GND for applying the driving power source Vcc are deployed at one end of the control unit 130. A power module 80 for supplying the power supply Vcc to the power terminal ends Vcc and GND may be integrally provided at the rear surface of the wearable flexible printed circuit board.

The control unit 130 may be applied to various signal processing apparatuses according to the required signal processing amount. Accordingly, since the control unit 130 requires a compact configuration, the control unit 130 may include a RAM (Random Access Memory) for temporarily storing data under signal processing and a memory device for storing various programs and data, integrally or separately.

Further, the control unit 130 performs a wireless communication function to receive the surrounding information about the environment sensed by the sensor unit 140a or the bio information about a user's body used for telemedicine and then transmit the received information to a terminal carried by a user. To this end, the control unit 130 has a communication function for performing short range wireless communication using the short range communication module 140b and the antenna pattern 160.

When the information transmitted by the wireless communication is bio information, the terminal carried by the user acts as a repeater for transmitting the bio information to the remote server through the mobile communication network.

Figure 3:
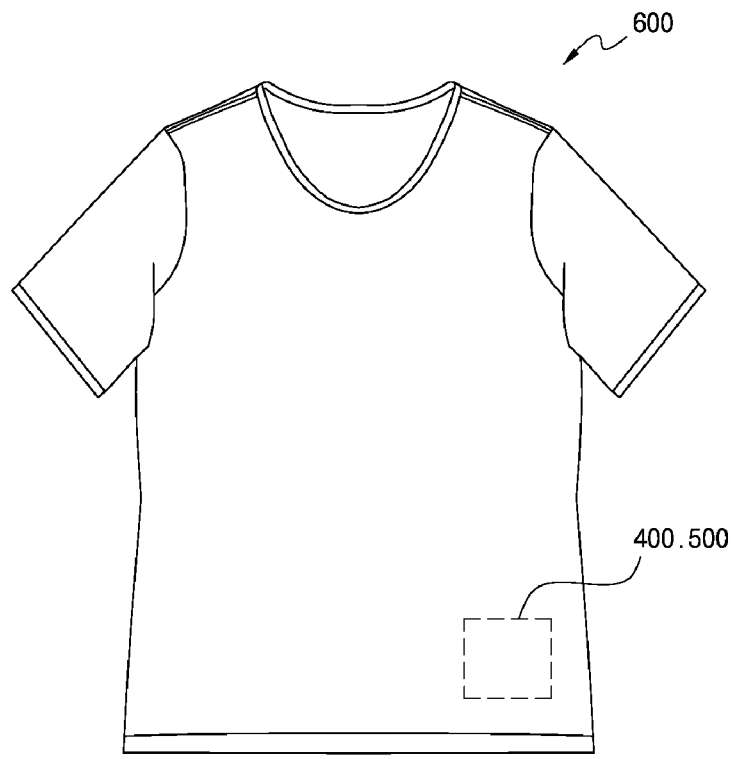
FIG. 3 is a view of a smart garment equipped with a wearable device according to an embodiment of the present invention.
Figure 4:
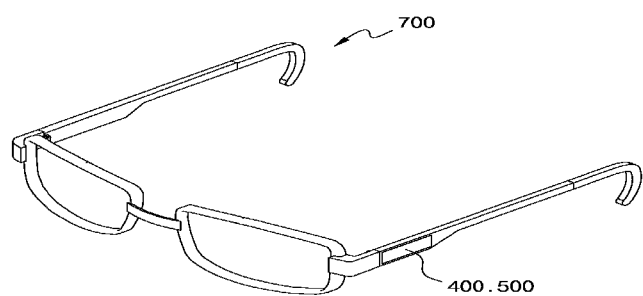
FIG. 4 is a view of smart glasses equipped with a wearable device according to an embodiment of the present invention.

When the wearable device according to an embodiment of the present invention includes the heater pattern 150, the control unit 130 supplies power to the heater pattern 150 and controls the temperature based on the detected temperature detected from the temperature sensor to maintain a constant temperature. When the wearable device is attached to and used in a garment worn by a wearer as shown in FIG. 3, the smart garment 600 is formed.

In this case, various electronic components such as the control unit 130, the sensor unit 140a and the short range communication module 140b are connected to the conductive circuit pattern 120 of the printed circuit board, and the antenna pattern 160 and the heater pattern 150 are formed directly on the fiber web 110 by using a method of printing a conductive paste on the fiber web 110.

Examples of the short range communication technology applied to the short range communication module 140b may include NFC (Near Field Communication), Bluetooth communication, RFID (Radio Frequency Identification) communication, IrDA (infrared data association), UWB (Ultra Wideband) communication, and ZigBee communication.

The wearable device may include active electronic components on a wearable flexible printed circuit board as the functional module, as shown in FIG. 13, but may include only passive electronic components without active electronic components.

Figure 21:
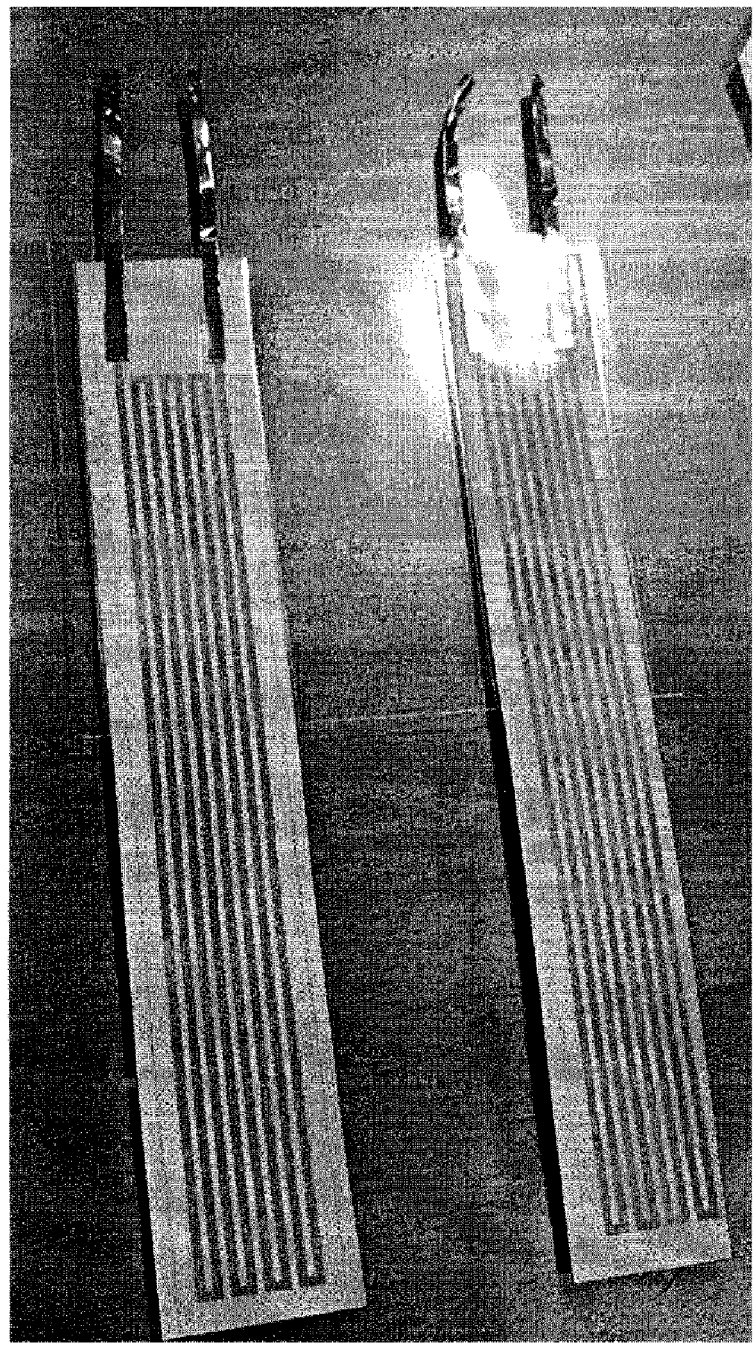
FIG. 21 is a photograph of a sample of a wearable flexible heater implemented by using a wearable flexible printed circuit board according to an embodiment of the invention.

For example, referring to FIG. 21, the heater pattern 150 may be formed by printing a conductive paste on a fiber web 110 by using a screen printing process, and a pair of power terminals may be attached to both ends of the heater pattern 150 by using a conductive adhesive. The thus-implemented wearable flexible heater may be designed in the size and pattern required by the user and may be embedded in the clothes.

Figure 22:
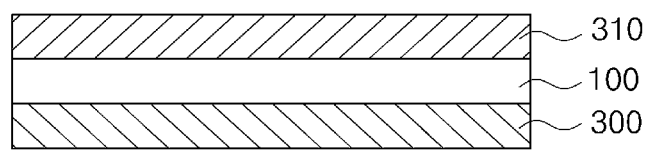
FIG. 22 is a cross-sectional view showing a base substrate that may be applied to a wearable flexible printed circuit board according to an embodiment of the present invention.

For example, as shown in FIG. 22, a wearable flexible printed circuit board 100 according to an embodiment of the present invention may be inserted between a cloth for lining 300 and a cloth for outsheath 310, so that winter heating garments may be sewn with a laminated fabric.

In addition, as an example of including only passive electronic components on a printed circuit board without active electronic components, a pair of conductive sensing patterns may be formed spaced apart at intervals by printing the fiber web 110 with a conductive paste to form a predetermined area, and a printed circuit board containing the pair of sensing patterns may be sewn on the inside of a sportswear so as to contact a user's body, to be applied as a biosensor for sensing a user's heart rate.

Further, in addition to the antenna pattern 160 and the heater pattern 150, the circuit pattern 120 may be formed with other types of patterns as needed.

Here, the circuit pattern 120 is preferably formed on the fiber web 110 with a conductive paste by using various printing methods.

The conductive paste may be an Ag paste or a Cu paste.

Figure 27:
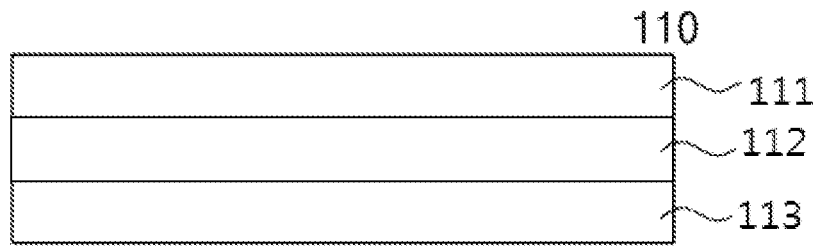
FIG. 27 is a cross-sectional view showing a three-layer fiber web structure according to an embodiment of the invention.

The fiber web 110 may have a single-layer structure, or as shown in FIG. 27, a three-layer fiber web structure composed of an upper layer 111, an intermediate layer 112, and a lower layer 113. In detail, the fiber web in the intermediate layer 112 may be implemented with a fiber diameter smaller than those of the upper and lower layers 111 and 113, or may be implemented into a non-porous web.

That is, when the conductive paste is printed on the upper layer 111 to form the circuit pattern 120, the conductive paste may penetrate into the pores of the upper layer 111, wherein relatively small pores defined as small diameter fibers of the intermediate layer 112 of the fibrous web 110 may prevent passage of the conductive paste penetrated from the upper layer 111 and penetration into the lower layer 113. In addition, when the intermediate layer is a non-porous web, it is possible to completely prevent penetration into the lower layer.

Here, the fiber diameter of the intermediate layer 112 is preferably in a range of 400 nm to 500 nm, and the fiber diameters of the upper layer 111 and the lower layer 113 are preferably more than 500 nm.

As described above, when the printed conductive paste does not pass from one side of the fiber web 110 to the other side thereof, it is preferable that the conductive paste has a thickness of about 20 μm to 100 μm. In this case, it is possible to form the different pattern 120 on the upper and lower surfaces of the fiber web 110.

When the fiber web 110 has a thickness of about 5 μm to 20 μm, the printed conductive paste passes from one side of the fiber web 110 to the other side thereof, and vertical energization is performed between the upper and lower surfaces of the fiber web 110. For example, in the case of the circuit pattern 120 used for a medical patch, it is preferable to use a vertical energization type structure. It is necessary to set the concentration of the paste to be relatively thin and the particle size of the conductive Ag and Cu powder to be large in the conductive paste used for the vertical energization.

A flexible printed circuit board using a conventional polyimide film as a substrate may not realize a vertical energization type substrate.

Figure 14:
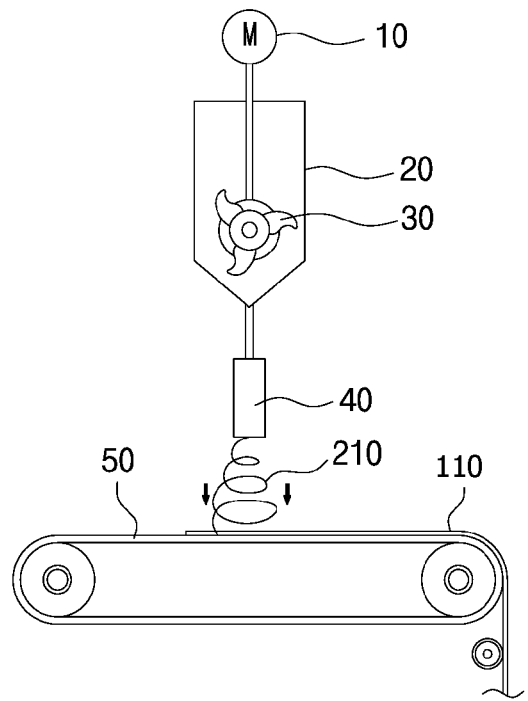
FIG. 14 is a schematic view for explaining an electrospinning apparatus for producing a fiber web that is used in a wearable flexible printed circuit board applied to an embodiment of the present invention.

FIG. 14 is a schematic view for explaining an electrospinning apparatus for producing a fiber web that is applied in a wearable flexible printed circuit board applied to an embodiment of the present invention.

Referring to FIG. 14, an electrospinning apparatus for manufacturing a wearable flexible printed circuit board according to an embodiment of the present invention is characterized in that a stirring tank 20 for supplying a stirred spinning solution is connected to a spinning nozzle 40, and a grounded collector 50 of a conveyor shape moving at a constant speed is disposed in a lower portion spaced apart from the spinning nozzle 40, in which the spinning nozzle 40 is connected to a high voltage generator (not shown).

Here, the fiber formation polymer material and the solvent are mixed with a stirrer 30 to prepare a spinning solution. Here, a pre-mixed spinning solution may be used before being put into the electrospinning apparatus without mixing in the stirrer 30.

Thereafter, when a high voltage electrostatic force is applied between the collector 50 and the spinning nozzle 40, the spinning solution is spun by the spinning nozzle 40 into the ultrafine fibers 210 to then be emitted to the collector 50. The fibers 210 are accumulated to the collector 50 to form the fiber web 110 of a non-woven fabric.

More specifically, the spinning solution discharged from the spinning nozzle 40 is discharged as the fibers 210 while passing through the spinning nozzle 40 charged by the high voltage generator, and the fibers are sequentially laminated on the grounded collector 50 provided in the form of a conveyor moving at a speed to form the fiber web 110.

Figure 15:
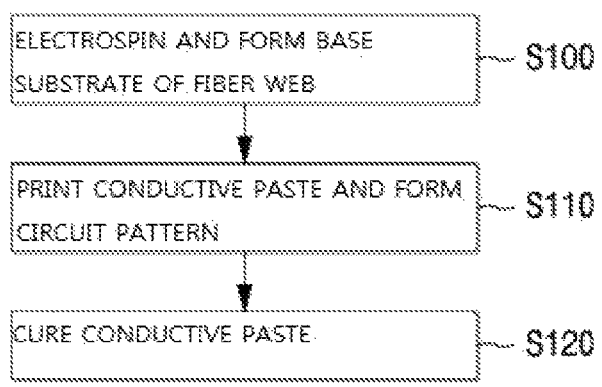
FIG. 15 is a flowchart of a method of manufacturing a wearable flexible printed circuit board according to an embodiment of the present invention.

Referring to FIG. 15, the method of manufacturing a wearable flexible printed circuit board according to an embodiment of the present invention includes the steps of: accumulating and calendering fibers 210 obtained by electrospinning a spinning solution containing a mixture of a polymer material and a solvent, to thus form a base substrate made of a fiber web 110 of a desired thickness (S100), printing a conductive paste on the fiber web to form a circuit pattern 120 (S110), and curing the printed conductive paste (S120).

Here, when the printed conductive paste is an Ag paste, the temperature to be cured is approximately 150° C. to 420° C. Thus, the temperature at which the printed conductive paste is cured may be set in consideration of the melting point of the polymer constituting the fibers.

That is, a single polymer or a mixed polymer capable of withstanding the curing temperature of the printed conductive paste may be applied. For example, PU (polyurethane) may be applied when curing at a low temperature of 200° C. or less, and polyacrylonitrile (PAN) and PES (polyether sulfone) may be applied when curing at a high temperature in excess of 200° C.

Figure 23:
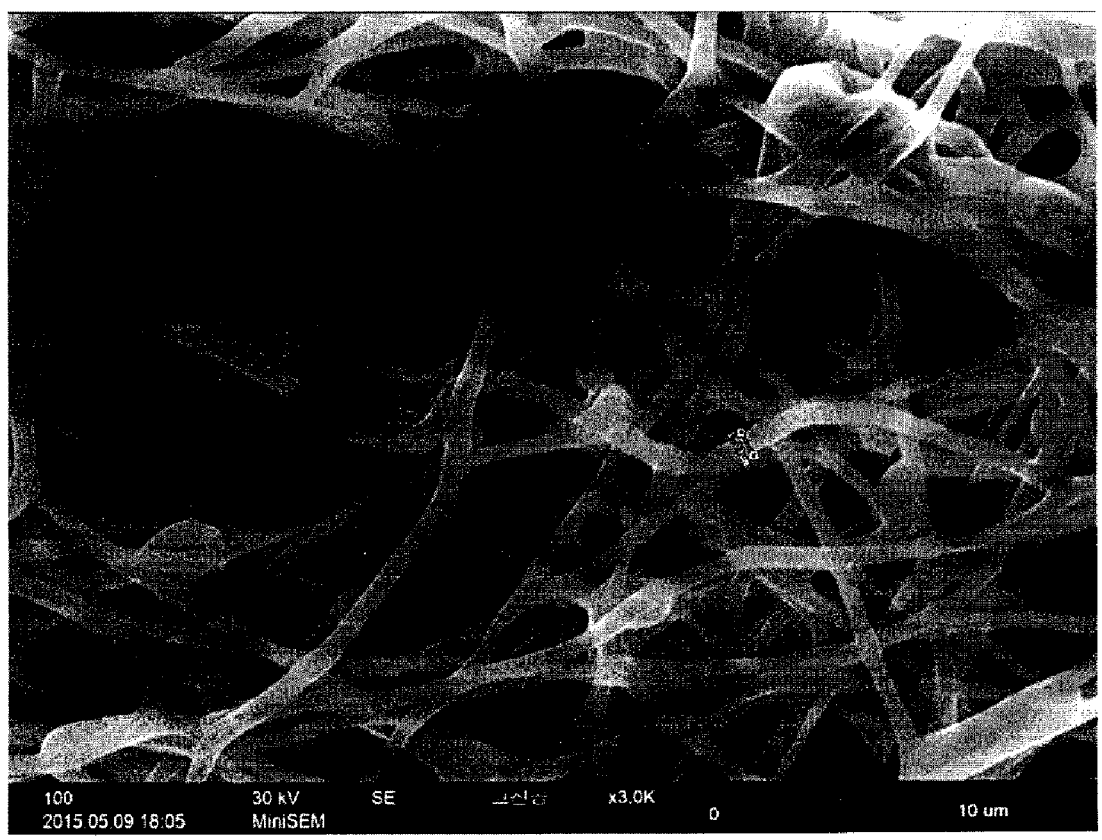
FIG. 23 is a photograph showing a SEM image in which a wearable flexible printed circuit board according to an embodiment of the invention is magnified.
Figure 24:
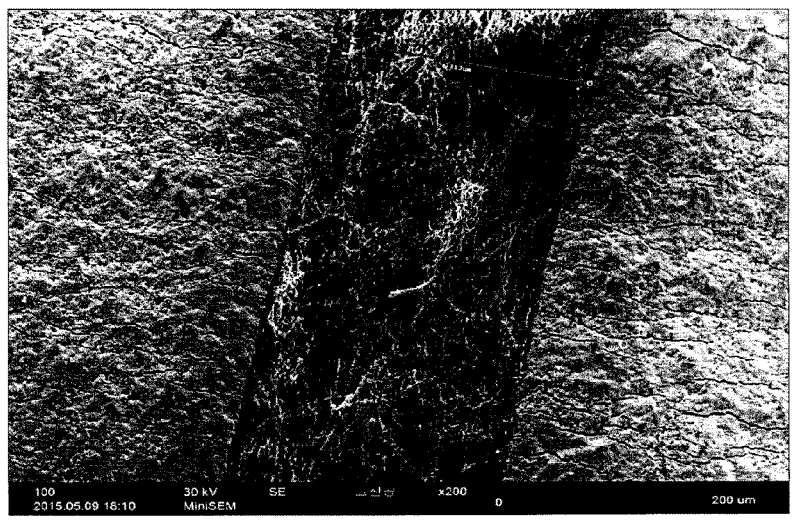
FIG. 24 is a SEM image obtained by enlarging and photographing a portion printed with a conductive circuit pattern on a wearable flexible printed circuit board according to an embodiment of the invention.
Figure 25:
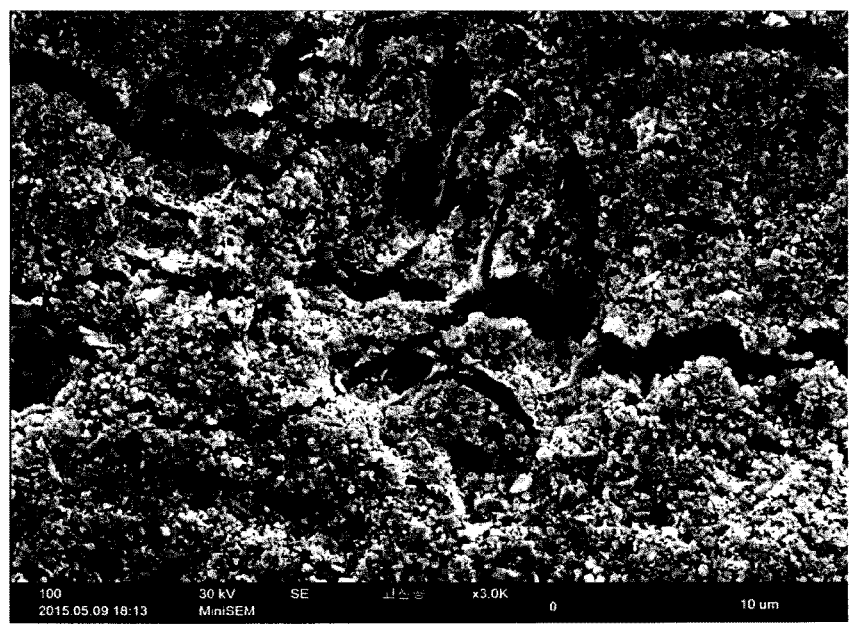
FIG. 25 is a SEM image obtained by enlarging and photographing a conductive circuit pattern printed on a wearable flexible printed circuit board according to an embodiment of the invention.

FIG. 23 shows a SEM (Scanning Electron Microscope) image obtained by enlarging and photographing a fiber web applied to a wearable flexible printed circuit board according to an embodiment of the present invention, at a magnification of 3000 times. FIG. 24 shows a SEM image obtained by enlarging and photographing a portion where a circuit pattern obtained by screen printing an Ag paste on a fiber web and sintering at 120° C. is arranged at either side of the fiber web, at a magnification of 200 times. FIG. 25 shows a SEM image obtained by enlarging and photographing a portion of the circuit pattern at a magnification of 3000 times.

Figure 16A:
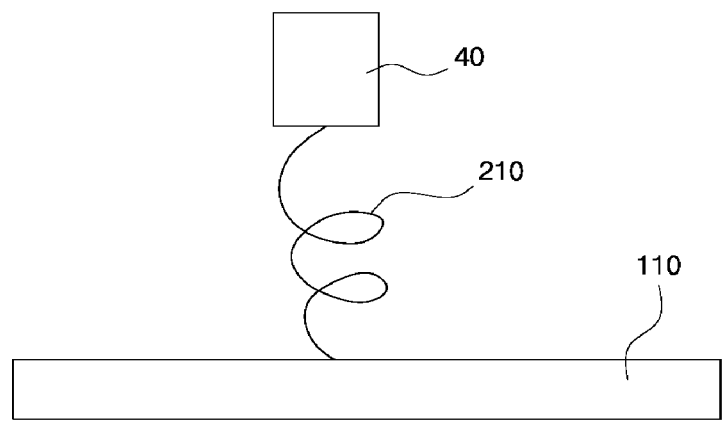
FIGS. 16A and 16B are conceptual cross-sectional views illustrating a method of manufacturing a wearable flexible printed circuit board according to an embodiment of the present invention.

Referring to FIGS. 14 and 16A showing a spinning apparatus, the spinning solution discharged from the spinning nozzle 40 is discharged to the fibers 210 while passing through the spinning nozzle 40 charged by the high voltage generator, and the fibers 210 are sequentially laminated on top of the grounded collector 50 of the conveyor shape moving at a constant speed, to thereby form the fiber web 110 of the process S100.

Figure 26:
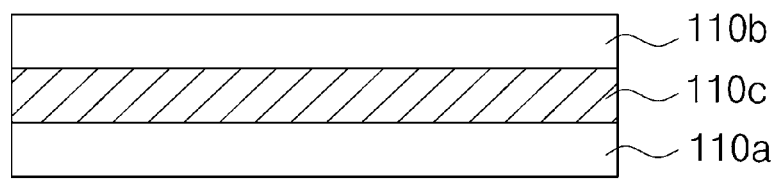
FIG. 26 is a cross-sectional view showing a laminated structure when a wearable flexible printed circuit board according to an embodiment of the invention is applied to a smart garment.

In addition, when the base substrate constituting the wearable flexible printed circuit board is insufficient in strength only by a single layer of the fiber web 110, a nonwoven fabric may be used as a strength reinforcing support 110c as shown in FIG. 26, and first and second fiber webs 110a and 110b may be laminated on one or both sides of the strength reinforcing support 110c, to form a multilayer structure.

Figure 16B:
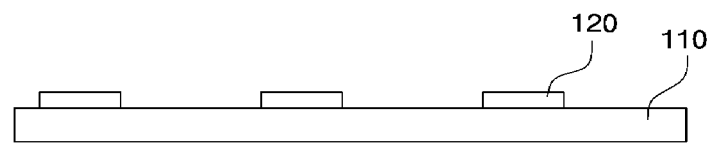

As shown in FIG. 16B, the conductive paste is printed on the fiber web 110 to form the circuit pattern 120, in the process S110.

When this process is performed, the circuit pattern 120 is printed on the fiber web 110. Here, as shown in FIG. 17, the circuit pattern 120 may be formed by filling the fibers 210 and the pores 211 of the fiber web 110 with a conductive paste. As shown in FIG. 18, the circuit pattern 120 may be formed only on the fibers 210.

Meanwhile, in some embodiments of the present invention, the flexibility of the wearable flexible printed circuit board may be maximized by applying a fiber web having substantial corrugated fibers.

Figure 19:
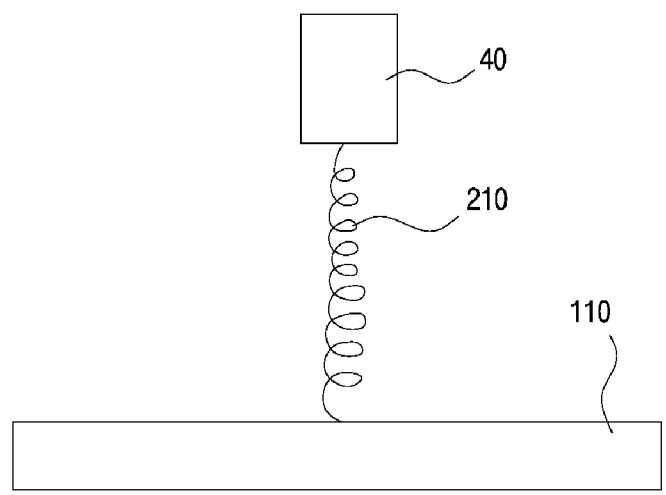
FIG. 19 is a view for explaining a method of forming a fiber web having corrugated fibers applied to a wearable flexible printed circuit board according to an embodiment of the present invention.
Figure 20:
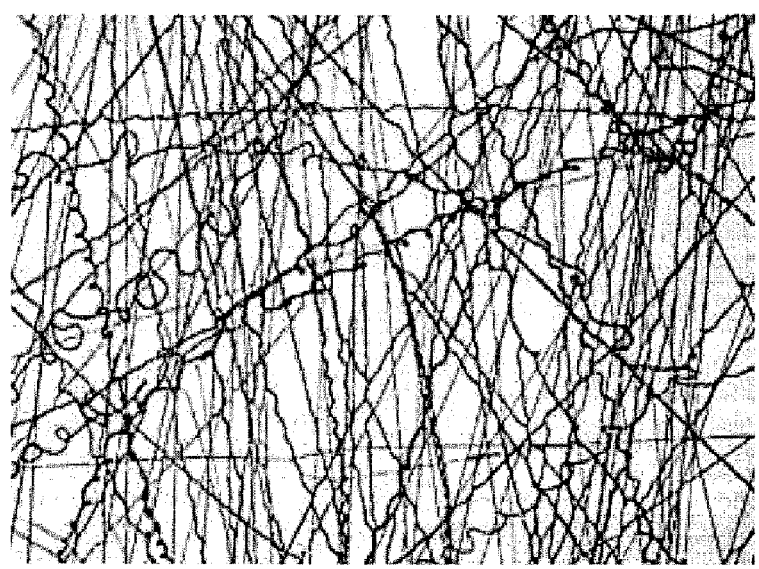
FIG. 20 is a SEM image showing a photograph of a fiber web having corrugated fibers applied to a wearable flexible printed circuit board according to an embodiment of the present invention.

That is, as shown in FIG. 19, when the radius of rotation of the fibers 210 emitted from the spinning nozzle 40 is reduced by electrospinning, substantially corrugated fibers as shown in the SEM photograph of FIG. 20 are accumulated to form a fiber web. Here, if the radius of rotation of the fiber 210 discharged from the spinning nozzle 40 is large, the fibers 210 having a linear shape are accumulated.

The radius of rotation of the fibers 210 emitted from the spinning nozzle 40 is involved with the humidity environment of electrospinning and the polymer concentration in the spinning solution.

First, when electrospinning is performed in a high-humidity environment, the volatility of the solvent in the fibers 210 discharged from the spinning nozzle 40 is accelerated, the diameter of the fibers 210 becomes thick, and the fibers 210 fall down with a small radius of rotation to then be accumulated. As a result, the fiber web 110 is made by accumulating the corrugated fibers 210. In some embodiments of the present invention, the high humidity environment may be set to have a humidity of 60% to 80%.

In other words, when the concentration of the solvent in the fibers 210 discharged from the spinning nozzle 40 is lowered, the corrugated fibers 210 are accumulated.

On the contrary, under a low humidity environment, the volatility of the solvent in the fibers 210 discharged from the spinning nozzle 40 is slowed down, the diameters of the fibers 210 becomes smaller, and the fibers fall and accumulate with a large turning radius. Therefore, the fibers 210 of approximately linear shape are accumulated to form the fiber web 110. Here, the low humidity environment may be set to an environment having a humidity of 60% or less, preferably a humidity of 45% or more and less than 60%.

Further, when the concentration of the polymer in the spinning solution is high, the concentration of the solvent contained in the fibers 210 discharged from the spinning nozzle 40 is low to produce the corrugated fiber 210. Conversely, when the polymer concentration is low, the concentration of the solvent contained in the fibers 210 increases to produce straight fibers 210.

While the present invention has been particularly shown and described with reference to exemplary embodiments thereof, by way of illustration and example only, it is clearly understood that the present invention is not to be construed as limiting the present invention, and various changes and modifications may be made by those skilled in the art within the protective scope of the invention without departing off the spirit of the present invention.

INDUSTRIAL APPLICABILITY

The present invention can be applied to a wearable device that can improve flexibility, restorability, waterproofness and air-permeability by applying a wearable flexible printed circuit board on which a circuit pattern is formed on a fiber web formed by accumulating fibers.

What is claimed is:

1. A wearable device comprising:
a wearable flexible printed circuit board including: a fiber web and a circuit pattern formed on the fiber web, the fiber web being made of electrospun and accumulated polymer fibers, and the fiber web having flexibility, air-permeability, and waterproofness; and a functional module mounted on the wearable flexible printed circuit board* wherein the fiber web is a three-layer fiber web structure composed of an upper layer, an intermediate layer and a lower layer, wherein the intermediate layer is a web formed of a fiber having a diameter smaller than those of the upper and lower layers, and further comprising a power module electrically connected to the wearable flexible printed circuit board to apply power to the functional module.

2. The wearable device of claim 1, wherein the electrospun and accumulated polymer fibers have a diameter of 400 nm to 3 μm.

3. The wearable device of claim 1, wherein the circuit pattern is formed on the electrospun and accumulated polymer fibers, and the pores of the fiber web.

4. The wearable device of claim 1, wherein the circuit pattern is formed on the electrospun and accumulated polymer fibers of the fiber web.

5. The wearable device of claim 1, wherein the circuit pattern is formed of a conductive paste printed on the fiber web.

6. The wearable device of claim 1, wherein the fiber web has a thickness of 20 μm to 100 μm.

7. The wearable device of claim 1, wherein the fiber web is laminated on one side or both sides of a strength reinforcing support.

8. The wearable device of claim 1, wherein the function module performs at least one of a body condition measurement function, a wireless communication function, an electronic device control function, a lighting function, a vibration detection function, a peripheral sound detection function, a position detection function, a black box function, a heat generation function, and a motion sensing function.

9. The wearable device of claim 1, wherein the functional module comprises at least one active element and at least one passive element.

10. The wearable device of claim 1, wherein the functional module comprises: a sensor unit; a short range communication module having an antenna pattern and used for short range wireless communication; and a control unit for signaling a sensing signal sensed by the sensor unit and wirelessly transmitting the sensed signal to a terminal by using the short distance communication module.

11. The wearable device of claim 10, wherein the sensor unit comprises at least one of a biosensor for detecting a user's physical condition and an environmental detection sensor for sensing a peripheral environment.

12. The wearable device of claim 9, wherein the passive element is a heater pattern.

* * * * *